United States Patent
Chih

(10) Patent No.: US 11,636,884 B2
(45) Date of Patent: *Apr. 25, 2023

(54) BACK-UP AND RESTORATION OF REGISTER DATA

(71) Applicant: Taiwan Semiconductor Manufacturing Company, Ltd., Hsinchu (TW)

(72) Inventor: Yu-Der Chih, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/587,610

(22) Filed: Jan. 28, 2022

(65) Prior Publication Data

US 2022/0157355 A1    May 19, 2022

Related U.S. Application Data

(63) Continuation of application No. 17/010,058, filed on Sep. 2, 2020, now Pat. No. 11,295,792.

(Continued)

(51) Int. Cl.
| | |
|---|---|
| *G06F 11/00* | (2006.01) |
| *G11C 7/20* | (2006.01) |
| *G06F 11/14* | (2006.01) |
| *G11C 11/4072* | (2006.01) |
| *G06F 11/30* | (2006.01) |
| *G06F 1/30* | (2006.01) |
| *G11C 5/14* | (2006.01) |

(52) U.S. Cl.
CPC .............. *G11C 7/20* (2013.01); *G06F 1/30* (2013.01); *G06F 11/1469* (2013.01); *G06F 11/3037* (2013.01); *G06F 11/3058* (2013.01); *G11C 5/148* (2013.01); *G11C 11/4072* (2013.01)

(58) Field of Classification Search
CPC .... G06F 1/30; G06F 11/1451; G06F 11/1469; G06F 11/3058; G11C 5/148; G11C 7/20
See application file for complete search history.

(56) References Cited

U.S. PATENT DOCUMENTS

| | | |
|---|---|---|
| 2009/0172350 A1 | 7/2009 | Norman |
| 2017/0185489 A1 | 6/2017 | Wu et al. |

(Continued)

FOREIGN PATENT DOCUMENTS

| | | |
|---|---|---|
| CN | 1447243 A | 10/2003 |
| CN | 106557438 A | 4/2017 |

(Continued)

*Primary Examiner* — Marc Duncan
(74) *Attorney, Agent, or Firm* — Merchant & Gould P.C.

(57) ABSTRACT

A system includes: a processor; a register configured to store a plurality of words, non-volatile memory having a plurality of cells, each cell corresponding to one of the words of the register, and wherein the each cell of the plurality of cells are set to an initial reset value; a first controller that in response to a loss in power: determines the word stored by the register; and changes the initial reset value of the cell of the non-volatile memory corresponding to the determined word stored by the register to a set value; a second controller that in response to detecting a restoration in power: identifies the cell having the set value; writes the word corresponding to the identified cell to the register; and resets the cells of the non-volatile memory to the initial reset value.

20 Claims, 7 Drawing Sheets

Related U.S. Application Data

(60) Provisional application No. 62/908,016, filed on Sep. 30, 2019.

(56) References Cited

U.S. PATENT DOCUMENTS

| | | |
|---|---|---|
| 2021/0104288 A1 | 4/2021 | Baumann et al. |
| 2021/0133052 A1 | 5/2021 | Cesaretti et al. |

FOREIGN PATENT DOCUMENTS

| | | |
|---|---|---|
| JP | 2008-282137 A | 11/2008 |
| JP | 2010-217941 A | 9/2010 |
| JP | 2011-90642 A | 5/2011 |
| KR | 1999-013772 A | 2/1999 |
| KR | 10-2015-0061286 A | 6/2015 |
| KR | 10-2019-0068902 A | 6/2019 |
| TW | 544585 B | 8/2003 |

400

| 4-bit Register Word Value 410 | Second NVM Cell Location 420 |
|---|---|
| 0000 | 0 |
| 0001 | 1 |
| 0010 | 2 |
| 0011 | 3 |
| 0100 | 4 |
| 0101 | 5 |
| 0110 | 6 |
| 0111 | 7 |
| 1000 | 8 |
| 1001 | 9 |
| 1010 | 10 |
| 1011 | 11 |
| 1100 | 12 |
| 1101 | 13 |
| 1110 | 14 |
| 1111 | 15 |

# BACK-UP AND RESTORATION OF REGISTER DATA

CROSS-REFERENCE TO RELATED APPLICATION

This application is a continuation of U.S. patent application Ser. No. 17/010,058 filed Sep. 2, 2020, which claims priority to U.S. Provisional Application No. 62/908,016 filed Sep. 30, 2019 the disclosure of which are hereby incorporated by reference in their entirety.

BACKGROUND

In general, computing systems include one or more processors and memory, including registers. Typically, registers consist of a small amount of fast storage. A register temporarily holds data, instructions and memory addresses that are frequently used by the CPU. There are various types of registers, each used for a specific purpose, including data registers, address registers, program counters, memory data registers, memory buffer registers, etc.

Registers can be either volatile or non-volatile. In case of volatile registers, a loss in power to the computing system can cause the register to lose its value. One example of avoiding losing valuable data stored in the register includes backing up the data value of the register in non-volatile memory. Typically, backing up registers includes saving a copy of each bit of register data in a corresponding bit of non-volatile memory. However, in case of a loss in power, quickly backing up register data using remaining power becomes increasing difficult to achieve as the number of data bits in the register increases.

BRIEF DESCRIPTION OF DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
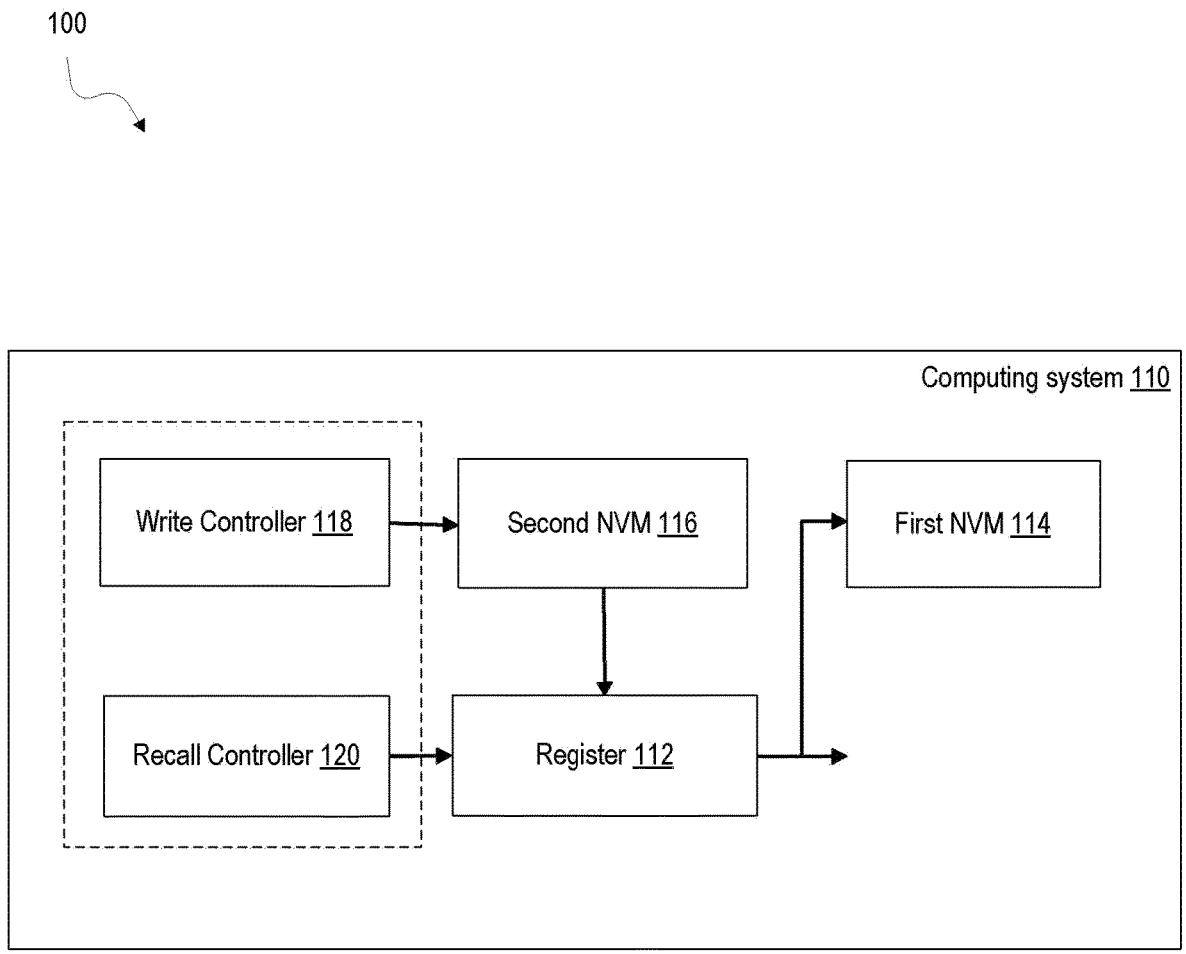
FIG. 1 is a block diagram illustrating an example of a fast register back-up system using non-volatile memory in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, computing systems use registers to store small amounts of data that need to be quickly accessed by the processors. Registers are normally measured by the number of bits they can hold, for example, 4-bit register, 8-bit register, etc. Computing systems may use several different kinds of registers include, but not limited to, address registers, user-accessible registers, status registers, general-purpose registers, instruction registers, memory buffer register, memory data register, and special-purpose register. Registers are typically volatile, but may sometimes be non-volatile as well.

Volatile memory is a type of computer storage that requires power to maintain the stored information. Volatile memory retains data while powered on, but when power is interrupted, the stored data is lost. By contrast, non-volatile memory circuits, which include flash, register RAM, magnetic RAM, Efuse RAM, antifuse RAM, among others, are designed to store data by assuming a state (e.g., a certain electric charge) that is not affected by loss of power to the non-volatile memory circuit. Non-volatile memory can thus be used to back up important data that is typically stored in the volatile memory in order to protect against data loss. In case of computing systems with volatile registers, there is a need to back up the register data in non-volatile memory in order to not lose the data in case of a power loss event.

Typically, when the computing systems lose power or when power becomes unstable, the limited remaining power is typically used to record the register log or backup the register log in non-volatile memory cells. This may mean that only a short period of time is available to update the non-volatile memory cells. For example, if a 4 bit volatile register is used, then upon experiencing a loss in power, each of the 4 bits need to be recorded into non-volatile memory in order to preserve the register data. However, the available power may be limited and may not be sufficient to complete the backup operation for all register data bits. Therefore, depending on the volume of the register data bits, the computing device may ultimately be unsuccessful in completing the back up operation.

Disclosed embodiments provide a method to back up data in a faster and more reliable manner. In one embodiment, an additional non-volatile memory is added and each cell number/location in the additional non-volatile memory corresponds respectively to a register data word value. Initially, the data bits in the additional non-volatile memory are reset to the same value, e.g. all zeros or all ones. When power loss happens, a cell number/location corresponding to the data value of the register is found, and the data in that cell location is inversed. When power is restored, the data bits of the additional non-volatile memory can be searched to obtain the cell number/location corresponding to the inversed value. Accordingly the obtained cell number/location can be used to identify the corresponding word value, which is then used to restore the register data value upon restoration of power.

FIG. 1 is a block diagram illustrating an example of a fast register back-up system using non-volatile memory. In one example, the hardware implementation of fast register back-up system 100 includes a computing system 110 that includes register 112, first memory 114, second memory 116, a write controller 118 and a recall controller 120. In some embodiments, first memory 114 and second memory 116 are non-volatile memories though other configurations are within the scope of the disclosure.

In one example, the register 112 is configured to store a small amount of data that needs to be quickly accessed by the processors of the computing system 110. Register sizes can vary and are typically measured in the number of bits that can be stored in the register. For example, a register that stores n bits of information (i.e. a 4-bit word) would be considered an n-bit register. Register sizes can vary and can include 4-bit register, 8-bit register, 16-bit register, 32-bit registers, etc. The register data are typically stored as binary numbers, meaning 0s and 1s. However, data can also be stored using other systems such as hexadecimal system. In some examples, register 112 can include, but is not limited to, address registers, user-accessible registers, status registers, general-purpose registers, instruction registers, memory buffer register, memory data register, and special-purpose register. Registers are typically volatile, but may sometimes be non-volatile as well. In one example, the register 112 is directly or indirectly connected to first non-volatile memory 114, as well as second non-volatile memory 116, a write controller 118 and a recall controller 120.

In one example the first memory 114 is a non-volatile memory that is connected to the register 112. However, in other examples of the fast register back-up system 100, the first non-volatile memory 114 may not be connected to the register 112 or may not be included in the computing system 110 at all. The first non-volatile memory 114 is used to store any type of data within the computing system 110. The register 112 may access the first non-volatile memory 114 to move data into the register 112 itself based on what the register is configured to do and the needs of the processors at the time. For example, if the processor that is configured to be part of the of the computing system 110 is processing data located in the first non-volatile memory 114 and the processor needs to frequently access that data, then the data may be pulled from the first non-volatile memory 114 and stored in the register 112. After the processor is done processing the data, the processed data may be removed from the register 112 and stored back in the first non-volatile memory 114.

In one example, the fast register back-up system 100 includes second non-volatile memory 116. The second non-volatile memory 116 is allocated by the computing system 110 to store the backup of the data from the register 112 in case of a power loss. The size of the second non-volatile memory 116 can vary depending on the size of the register 112. In case of a binary system, for an n-bit register, the second non-volatile memory 116 is $2^n$ bits in size. For example, for a 4-bit register, the computing system 110 allocates 16 bits of non-volatile memory as second non-volatile memory 116. All cells within the second non-volatile memory 116 are reset to an initial reset value. The initial reset value may be a 0 or 1.

In one example, the fast register back-up system 100 includes one or more memory controllers. Typically, a memory controller is a digital circuit that manages the flow of data going to and from the computer's memory, including the register 112, first non-volatile memory 114 and second non-volatile memory 116 in this case. In one example, the fast register back-up system 100 includes a write controller 118 and a recall controller 120.

In one example, controller includes a write controller 118 and a recall controller 120. The write controller 118 is used to check whether the register 112 has any updated data that needs to be backed up. In addition, the write controller 118 is also used to perform a programming process, specifically, to set the data bits in the second non-volatile memory 116 when power loss happens.

In one example, the recall controller 120 is configured to update the register 112 with the backed up data upon the computing system recovering power. The process of updating the register 112 can include searching the second non-volatile memory 116 to identify a cell with a predetermined value or indicator, reverse mapping the cell with the identified value to the data value of the register prior to power loss, and updating the register 116 with the recovered data value. The process of mapping and reverse mapping the additional non-volatile memory cell to the data value of the register is described in detail in relation to FIG. 4.

Figure 2:
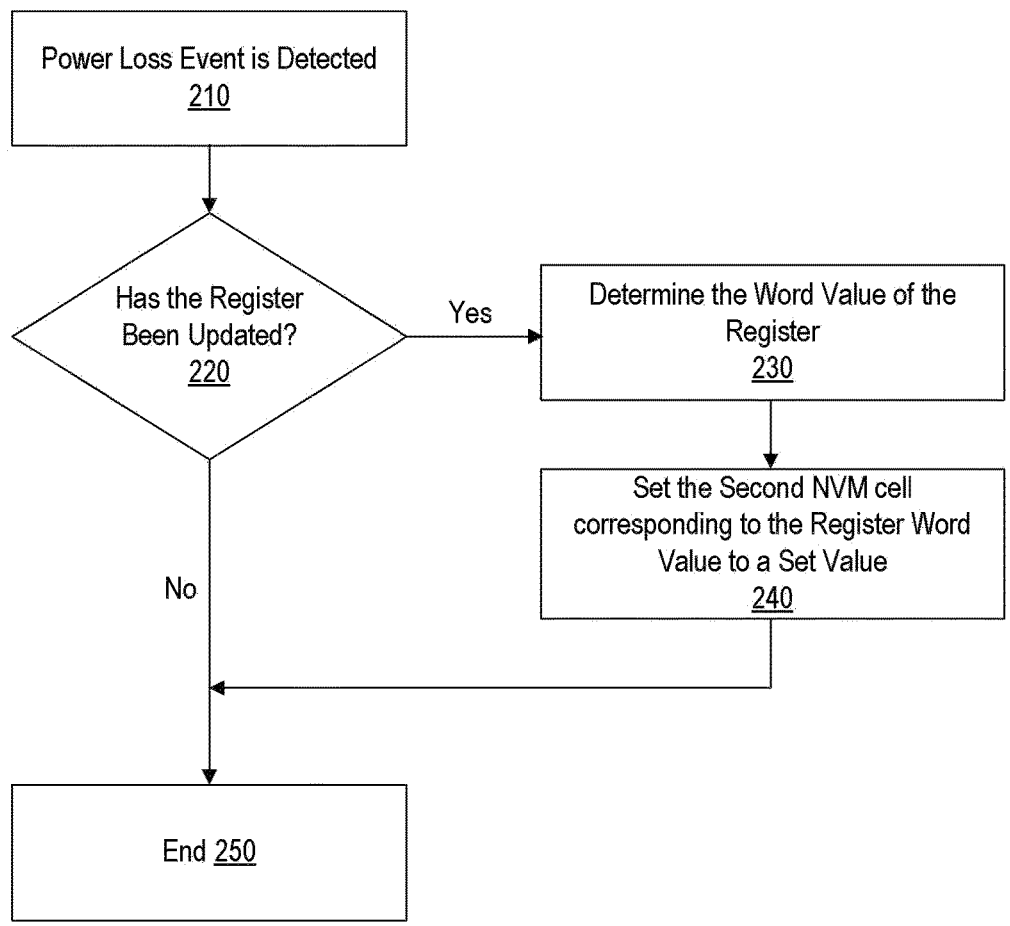
FIG. 2 is a flow diagram illustrating an example of a back-up method during a power loss event in accordance with some embodiments.

FIG. 2 is a flow diagram 200 illustrating an example of a back-up method using a fast register back-up system during a power loss event. Initially, during example operation 210, the fast register back-up system 100 detects a power loss event. A power loss event can include any disruption in power to the computing system 110 including complete loss of power to the computing system 110 or instability in the power to the computing system 110. In example operation 220, upon detecting a power loss event, the write controller 118 checks the data in the register 112 to see if the register data had any updates that would benefit from being backed up.

In example operation 230, upon determining, based on operation 220, that there were updates to the register data that need to be backed up, the write controller 118 analyzes the register data and determines the word value associated with the register data. In one example, the word value of n bits of data may be the decimal equivalent of the n bits together. For example, for a 4-bit register including a 4-bit word having the following binary bits: "1001" ($4^{th}$ bit: 1; $3^{rd}$ bit: 0; $2^{nd}$ bit: 0 and $1^{st}$ bit 1), an example word value would be 9. The word value of the register is determined in operation 230 in order to identify the additional non-volatile memory cell that would be used in the backup process. An example mapping between the word value of the register data and the non-volatile memory cell where the register data is backed up is discussed in greater detail in relation to FIG. 4.

In example operation 240, the identified second non-volatile memory cell corresponding to the word value of the register data is set to the set value. In the illustrated example, the set value is an inverse of the initial reset value that all non-volatile memory cells are set at. In case of a binary system, if each of the cells of the second non-volatile memory 116 is set to an initial reset value of 1, then the cell that is mapped to the register word value is set to a set value of 0, the inverse of the initial reset value of 1, when the register data is backed up. Similarly, if the initial reset value is set to 0, then the set value, which is the inverse of the initial reset value, is 1. The initial reset value of the additional non-volatile memory can be either 0 or 1 in a binary system. The back-up process is configured to mark the additional non-volatile memory cell in a way to easily identify the word value of the register 112.

Since each possible word value associated with the register data is mapped to a corresponding one of the cells of the second non-volatile memory 116, only one bit of the second non-volatile memory 116 needs to be set in order to completely back up the register data. In this case, the size of the register does not matter. No matter the size of the register, only one bit needs to be set in order to back up the register data using the fast back-up system. Only updating one bit during the backup process makes the fast register back-up system faster than traditional back-up methods, which call for backing up each bit of the register. Thus, in a traditional back-up system, for a 4-bit register, 4 bits of non-volatile memory need to be updated; for an 8-bit register, 8 bits of non-volatile memory need to be updated and so on. Since the fast register back-up system only needs 1 bit to be updated during a power loss event, the fast back-up system is also more reliable because there is an increased probability that the backup process can be completed before total power loss.

Upon completing operation 240, in operation 250, the fast back-up process is complete and the fast back-up method during power loss 200 comes to an end. In addition, if the write controller 118 determines that the register has not been updated, and/or the register data need not be backed up, then fast back-up method during the power loss 200 also comes to an end in operation 250. Step 250 concludes the back-up process that is initiated upon detecting a power loss event.

Figure 3:
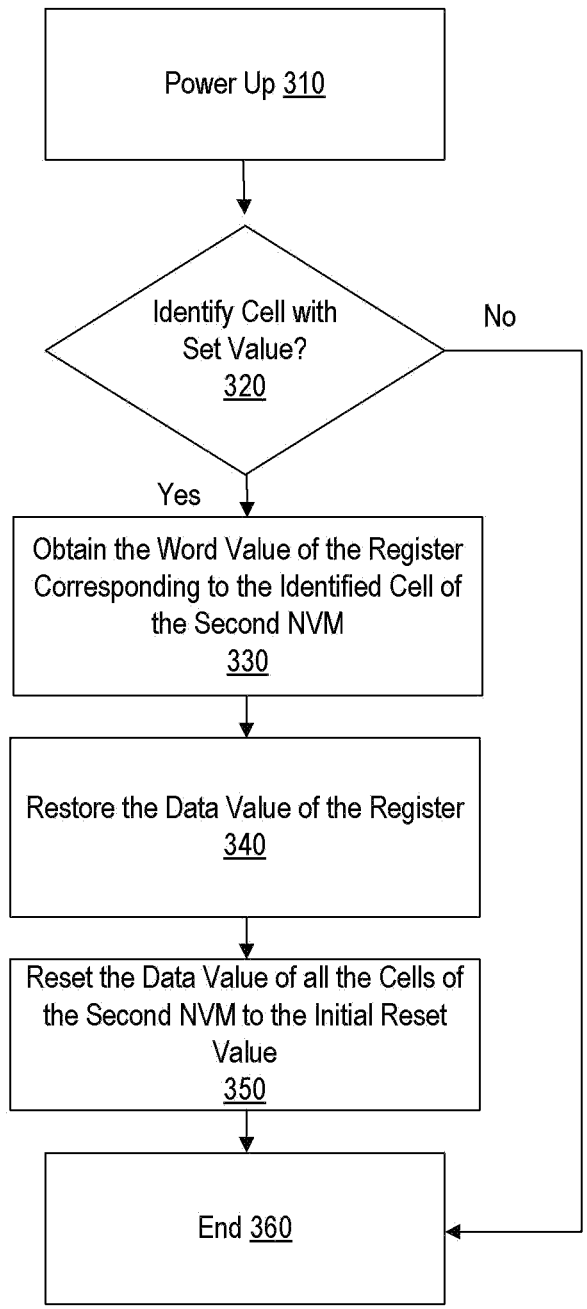
FIG. 3 is a flow diagram illustrating an example of a restoration method during a power up event in accordance with some embodiments.

FIG. 3 is a flow diagram 300 illustrating an example of a method to restore data during a power up event. Initially, during example operation 310, the fast register back-up system 100 detects a power up event. Power up event can include restoration of power to the fast register back-up system 100 after a period of complete power loss, or restoration of stable power to the fast register back-up system 100 after a period of power instability.

In example operation 320, upon detecting a power up event in operation 310, the recall controller 120 searches the second non-volatile memory 116 and identifies the cell having a data value set at the set value. If none of the cells of the second non-volatile memory 116 is set to the set value, then the register data was not backed up for any number of reasons including: the register 112 was not updated and thus did not require back up, or the fast register back-up system 100 did not have enough time to complete the backup process. If none of the cells of the second non-volatile memory 116 is set to the set value, then the recall controller ends the method to restore the register data in operation 360. Otherwise, the recall controller progresses to the next operation in the flow diagram 300.

Figure 4:
FIG. 4 is a table illustrating an example mapping between the register value and the additional non-volatile memory cell location in accordance with some embodiments.

In example operation 330, the recall controller obtains the word value of the register 112 based on the cell in the second non-volatile memory 116 that has the set value using a reverse mapping process that is described in more detail in relation to FIG. 4. Subsequently, in example operation 340, the identified word value of the register 112 is used to restore the data value of the individual bits of the register 112.

In example operation 350, once the register 112 is restored, the data value of the all of the cells of the second non-volatile memory 116 is reset to the initial reset value. The reset process is done to prepare the cells of the second non-volatile memory 116 for fast back-ups in case of another power loss event. Upon resetting the data value of the additional non-volatile memory cells, the method for restoring the register data ends in example operation 360.

FIG. 4 is a table 400 illustrating an example mapping between the register word value and the additional non-volatile memory cell location for a 4-bit register. In a binary system, each data bit can have a data value of 0 or 1. For 4 bits of data (i.e. 4-bit words), the data values can range from "0000" to "1111." In total, for 4 bits of data, there are $2^4$ or 16 possible combinations of word values. An 8-bit register comprises at least 256 possible combinations of word values and thus can require at least 256 additional non-volatile memory cells. Similarly, a 16-bit register comprises at least 65536 possible combinations of word values and thus can require at least 65536 additional non-volatile cells.

For the current example of a 4-bit register, all 16 possible word values are listed on the left hand side of the table under "4-bit Register Word Value" 410. The corresponding 16 additional non-volatile memory cell locations 420 that map to each of the word values listed on the left hand side of the table are listed on the corresponding right hand side cell of the table. For example, the word value 1001 is mapped to the cell location "9." In the example mapping table 400, each word value 410 is mapped to a cell location 420 that corresponds to the decimal equivalent of the word value itself. In other words, "0000" is mapped to "0," "0011" is mapped to "3," "1101 is mapped to "13" and so on. However, the mapping between the register word value and the additional non-volatile memory cell location does not need to correspond to the equivalent decimal values as in the example. For example, "0000" can be mapped to "15" or "0000" can be mapped to "2" or any other cell location as long as the mapping information is stored and can be retrieved and used by the fast register back-up system 100 as needed. During power up, the same mapping table 400 can be used to reverse map the cell location of the additional non-volatile memory with the set value to the word value of the register.

Figure 5A:
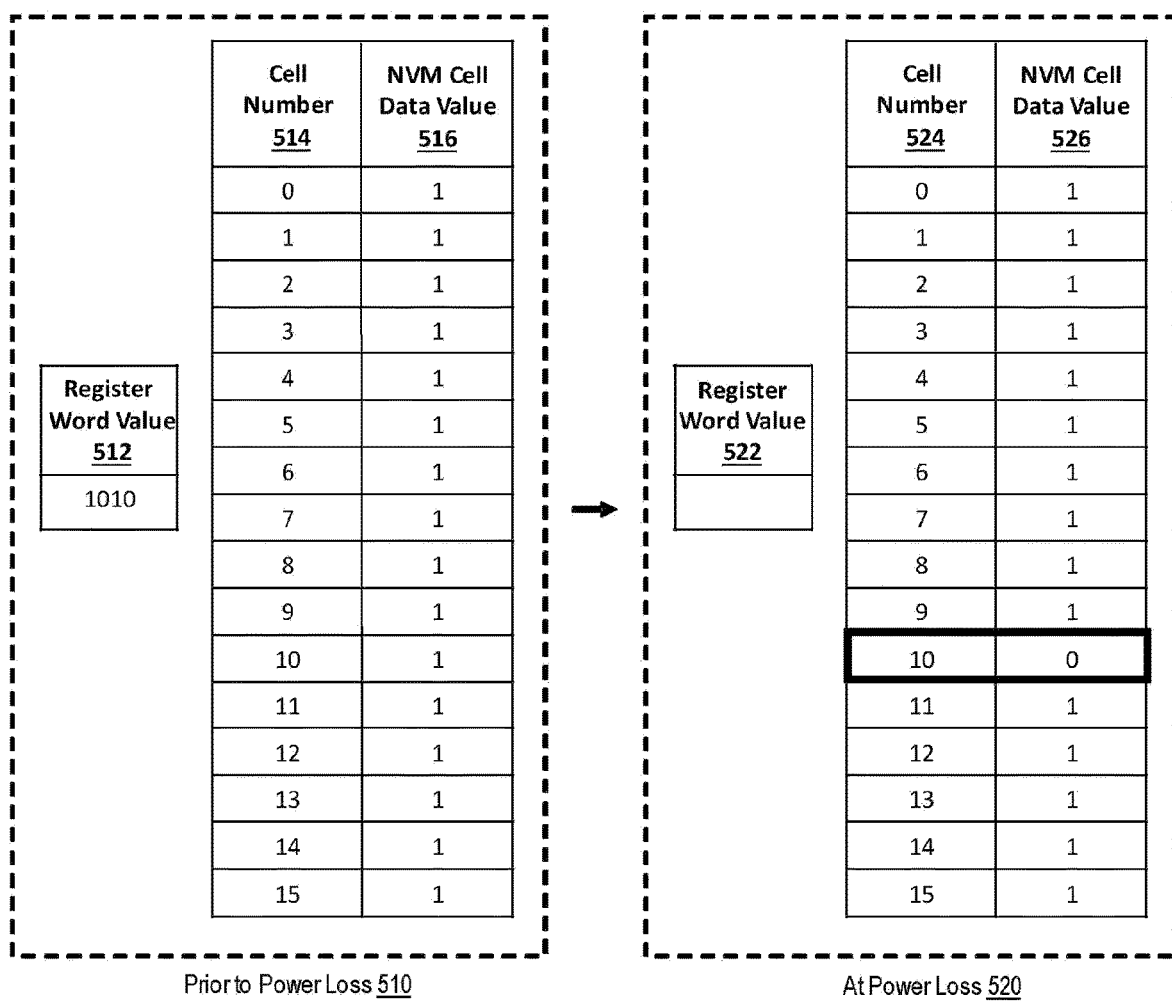
FIGS. 5a and 5b illustrate example power loss and power restoration operations associated with the fast register back-up system in accordance with some embodiments
Figure 5B:
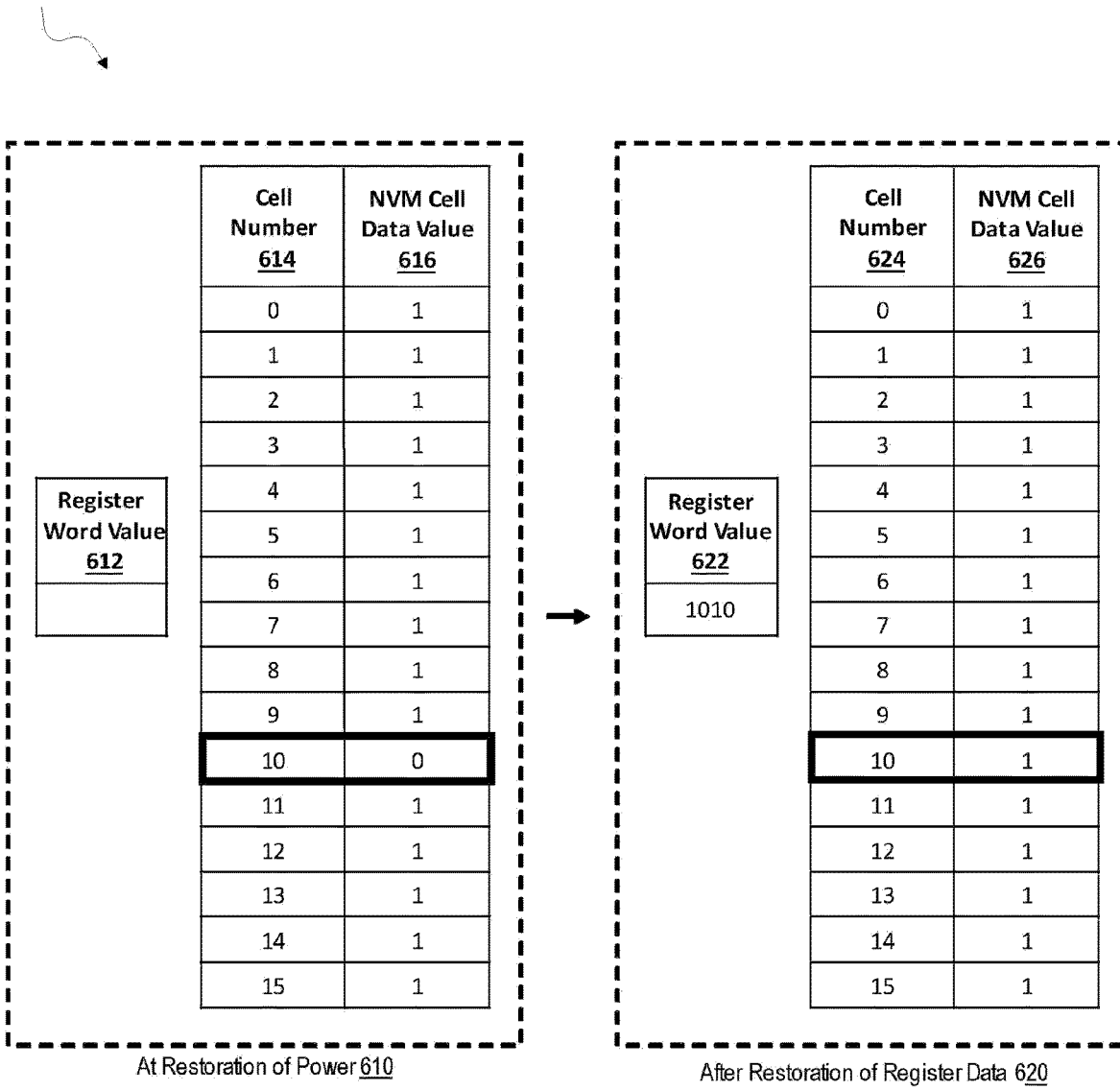

FIGS. 5a and 5b illustrate an example power loss operation 500 and an example power up operation 600 associated with the fast back-up of a 4-bit register, wherein the register has a word value of "1010." Particularly, FIG. 5a illustrates the register word value 512, 522 and the corresponding additional non-volatile memory cell number 514,524 and cell data value 516, 526 as it exists prior to power loss 510 and upon detecting power loss 520. Prior to power loss 510, the register word value 512 is "1010." The 16 additional non-volatile memory cells corresponding to the 4-bit register are all reset to an initial reset value of "1" for this example. In other examples, the initial reset value can be "0" instead of "1."

For this example, the register word values are mapped to the corresponding additional non-volatile memory cells with a cell number or location that is the decimal equivalent of the register word value. As discussed above in relation to FIG. 4, the mapping scheme may be different in different examples. At power loss 520, the register word value 522 loses its data value. The fast register back-up system 100 uses the mapping scheme to find the cell number 524 corresponding to the decimal equivalent of the register word value "1010." In this case, the decimal equivalent of "1010" is "10." Therefore, the data value of the additional non-volatile memory cell number "10" is changed from the initial reset value "1" to the set value "0." The data value of the rest of the cells in the additional non-volatile memory remains at "1."

FIG. 5b illustrates the register word value 612, 622 and the corresponding additional non-volatile memory cell number 614, 624 and cell data value 616, 626 as it exists at the time of restoration of power 610 and after the restoration of the register data value is complete 620. Upon restoration of power 610, the register word value 612 is empty because the register lost its data value at power loss and is still waiting for it to be restored. Similarly, cell number "10" of the additional non-volatile memory is still at "0" at restoration of power 610.

After a restoration of power is detected, the fast register back-up system 100, using the recall controller 120 searches the cells of the additional non-volatile memory for a cell with the data value set at the set value of "0." In this case, cell number "10" of the additional non-volatile memory cells is identified as the cell with the data value 616 of "0." The recall controller 120 then converts the cell number using a reverse mapping method discussed in relation to FIG. 4 to identify the word value corresponding to the identified cell number. In this example, the identified cell number "10" is determined to correspond to the word value "1010" and the register word value 622 is restored accordingly. After the register word value 622 is restored to its original value, "1010," the data value of all cells in the additional non-volatile memory 626, are set back to the initial reset value of "1." Thus, at time 620, the register 622 and the additional non-volatile memory cells 626 are fully restored to their original values as seen at time 510.

Figure 6:
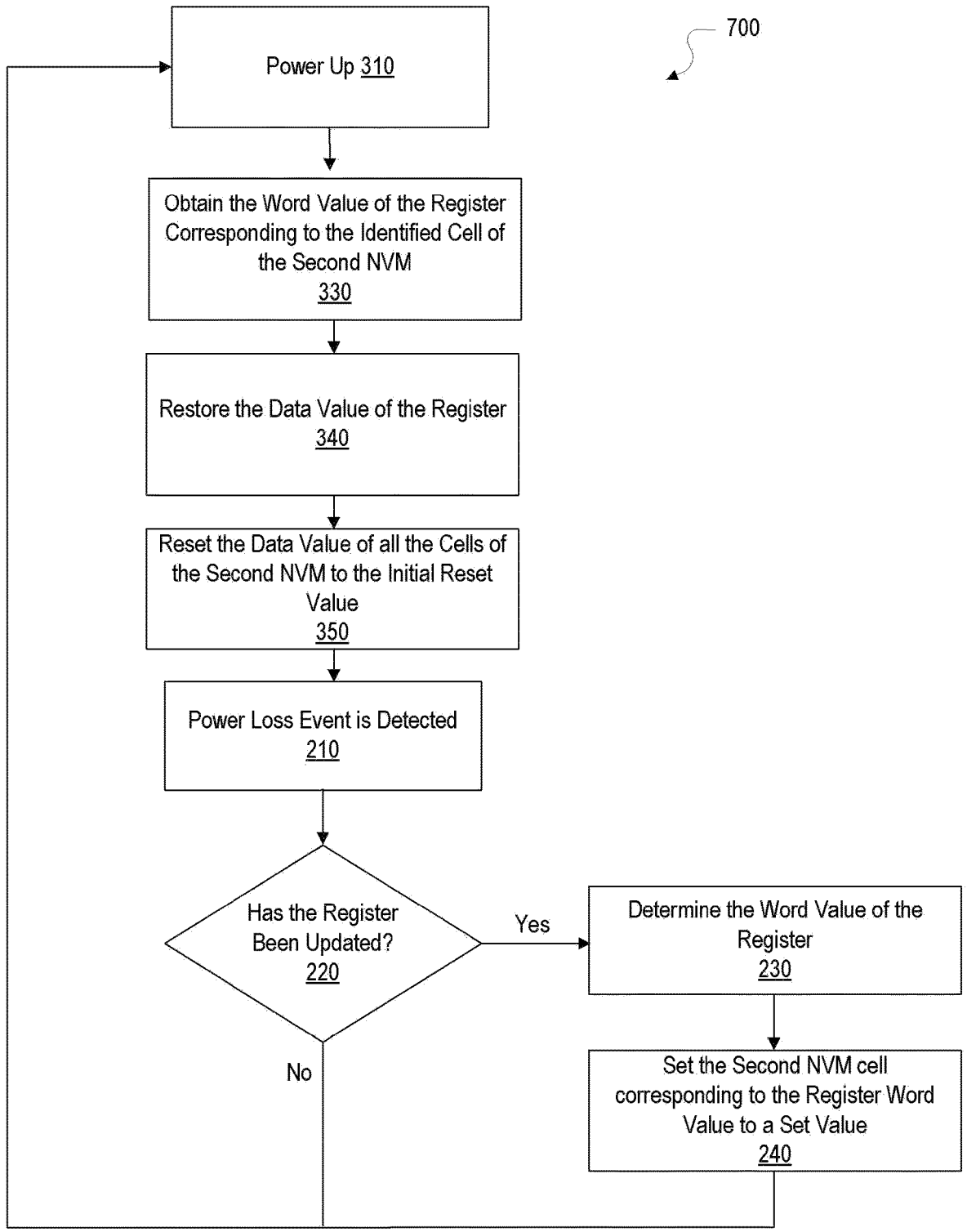
FIG. 6 is a flow diagram illustrating an example of a combined restoration and back-up method in accordance with some embodiments.

FIG. 6 illustrates another example method 700 that combines aspects of the methods shown in FIGS. 2 and 3 discussed above. At operation 310, the fast register back-up system 100 detects a power up event. The power up event can include restoration of power to the fast register back-up system 100 after a period of complete power loss, or restoration of stable power to the fast register back-up system 100 after a period of power instability.

Upon detecting a power up event in operation 310, the recall controller 120 searches the second non-volatile memory 116 and identifies the cell having a data value set at the set value. In example operation 330, the recall controller obtains the word value of the register 112 based on the cell in the second non-volatile memory 116 that has the set value using a reverse mapping process such as that described in conjunction with FIG. 4. Subsequently, in example operation 340, the identified word value of the register 112 is used to restore the data value of the individual bits of the register 112.

In example operation 350, once the register 112 is restored, the data value of the all of the cells of the second non-volatile memory 116 is reset to the initial reset value. The reset process is done to prepare the cells of the second non-volatile memory 116 for fast back-ups in case of another power loss event. Upon resetting the data value of the additional non-volatile memory cells, the method for restoring the register data ends in example operation 360.

In operation 210, the fast register back-up system 100 detects a power loss event. A power loss event can include any disruption in power to the computing system 110 including complete loss of power to the computing system 110 or instability in the power to the computing system 110. In example operation 220, upon detecting a power loss event, the write controller 118 checks the data in the register 112 to see if the register data had any updates that would benefit from being backed up.

In example operation 230, upon determining, based on operation 220, that there were updates to the register data that need to be backed up, the write controller 118 analyzes the register data and determines the word value associated with the register data. In one example, the word value of n bits of data may be the decimal equivalent of the n bits together. The word value of the register is determined in operation 230 in order to identify the additional non-volatile memory cell that would be used in the backup process.

In example operation 240, the identified second non-volatile memory cell corresponding to the word value of the register data is set to the set value. In the illustrated example, the set value is an inverse of the initial reset value that all non-volatile memory cells are set at. In case of a binary system, if each of the cells of the second non-volatile memory 116 is set to an initial reset value of 1, then the cell that is mapped to the register word value is set to a set value of 0, the inverse of the initial reset value of 1, when the register data is backed up. Similarly, if the initial reset value is set to 0, then the set value, which is the inverse of the initial reset value, is 1. The initial reset value of the additional non-volatile memory can be either 0 or 1 in a binary system. The back-up process is configured to mark the additional non-volatile memory cell in a way to easily identify the word value of the register 112.

Since each possible word value associated with the register data is mapped to a corresponding one of the cells of the second non-volatile memory 116, only one bit of the second non-volatile memory 116 needs to be set to the set value in order to completely back up the register data. In this case, the size of the register does not matter. No matter the size of the register, only one bit needs to be set in order to back up the register data using the fast register back-up system. Only updating one bit during the backup process makes the fast back-up system faster than traditional back-up methods, which call for backing up each bit of the register. Thus, in a traditional back-up system, for a 4-bit register, 4 bits of non-volatile memory need to be updated; for an 8-bit register, 8 bits of non-volatile memory need to be updated and so on. Since the fast register back-up system only needs 1 bit to be updated during a power loss event, the fast register back-up system is also more reliable because there is an increased probability that the backup process can be completed before total power loss.

The method then returns to operation 310 regarding sensing of a power up. If the write controller 118 determines that the register has not been updated in operation 220, and/or the register data need not be backed up, then fast back-up method during the power loss 200 also returns to operation 310 to determine a power up event.

In accordance with some embodiments, a method for fast back-up of register values at power loss is disclosed. The method includes providing a register configured to store a plurality of words, and providing a non-volatile memory having a plurality of cells, where each cell corresponds to one of the words of the register. Each cell of the non-volatile memory is set to an initial reset value. In response to detecting a loss of power, the word stored by the register is determined and the initial reset value of the cell of the non-volatile memory corresponding to the determined word stored by the register is changed to a set value.

In accordance with further embodiments, a method for fast restoration of register values at power restoration is disclosed. The method includes providing a register configured to store a plurality of words, and providing a non-volatile memory having a plurality of cells, where each cell corresponding to one of the words of the register. In response to detecting a restoration in power after a loss of power, the cell having a set value is identified, and the word corresponding to the identified cell is written to the register. The cells of the non-volatile memory are then reset to an initial reset value.

In accordance with other embodiments, a system for fast back-up and restoration of register values at power loss and subsequent power restoration is disclosed. The system includes a first memory configured to store data, and a register configured to store a plurality of words. The register is configured to receive the data from the first memory and store the data as one of the plurality of the words. A second non-volatile memory has a plurality of cells. Each of the plurality of words has a corresponding cell of the second non-volatile memory, and each cell of the plurality of cells is reset to an initial reset value. In response to a loss in power, a controller is configured to determine the one of the plurality of words stored by the register, and change the initial reset value of the corresponding cell of the second non-volatile memory to a set value. In response to a restoration in power, the controller is configured to identify the corresponding cell of the second non-volatile memory having the set value, write the one of the words of the identified corresponding cell to the register, and reset the identified corresponding cell to the initial reset value.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system comprising:
   a register configured to store a plurality of words;
   a non-volatile memory having a plurality of cells, each cell corresponding to one of the plurality of words of the register;
   a controller, wherein in response to a loss in power the controller is configured to:
      determine the word stored by the register; and
      change the initial reset value of the cell of the non-volatile memory corresponding to the determined word stored by the register to a set value.

2. The system of claim 1, wherein, in response to detecting a restoration in power, the controller is further configured to:
   identify the cell having the set value;
   write the word corresponding to the identified cell to the register; and
   reset the cells of non-volatile memory to the initial reset value.

3. The system of claim 2, wherein, the controller includes a recall controller and a write controller.

4. The system of claim 3, wherein:
   the recall controller is configured to change the initial reset value of the cell of the non-volatile memory to the set value in response to the loss in power; and
   the write controller is configured to identify the cell of the non-volatile memory having the set value, and write the word corresponding to the identified cell to the register in response to the restoration in power.

5. The system of claim 1, wherein each of the plurality of words includes n bits and wherein n is an integer equal or greater than 0.

6. The system of claim 5, wherein the plurality of words includes $2^n$ words.

7. The system of claim 5, wherein the plurality of cells includes $2^n$ cells.

8. The system of claim 1 further comprising determining whether the register has updated since the detecting the loss of power.

9. A system comprising:
   a register configured to store a plurality of words;
   a non-volatile memory having a plurality of cells, each cell corresponding to one of the words of the register;
   a controller, wherein in response to detecting a restoration in power after a loss of power, the controller is configured to:
      identify the cell having a set value;
      write the word corresponding to the identified cell to the register; and
      reset the cells of non-volatile memory to an initial reset value.

10. The system of claim 9, wherein the cells of the non-volatile memory are reset to the initial reset value by a write controller.

11. The system of claim 9, wherein each of the plurality of words includes n bits and wherein n is an integer equal or greater than 0.

12. The system of claim 11, wherein the plurality of words includes $2^n$ words.

13. The system of claim 11, wherein the plurality of cells includes $2^n$ cells.

14. The system of claim 9 further comprising determining whether the register has updated since detecting the loss of power.

15. A method comprising:
   providing a first memory configured to store data;
   providing a register configured to store a plurality of words, wherein the register is configured to receive the data from the first memory and store the data as one of the plurality of the words;
   providing a second non-volatile memory having a plurality of cells, each of the plurality of words having a corresponding cell of the second non-volatile memory, wherein the each cell of the plurality of cells is set to an initial reset value;
   wherein in response to a loss in power:
      determining the one of the plurality of words stored by the register; and
      changing the initial reset value of the corresponding cell of the second non-volatile memory to a set value; and
   wherein in response to a restoration in power:
      identifying the corresponding cell of the second non-volatile memory having the set value;
      writing the one of the words of the identified corresponding cell to the register; and
      resetting the identified corresponding cell to the initial reset value.

16. The method of claim 15, wherein in response to detecting the restoration in power, further comprising:
   writing the one of the words of the identified corresponding cell to the first memory.

17. The method of claim 15, wherein each of the plurality of words stored has n bits where n is an integer equal or greater than 0, wherein the plurality of words includes $2^n$ words, and wherein the second non-volatile memory includes $2^n$ cells.

18. The method of claim 15, wherein the first memory is a non-volatile memory.

19. The method of claim 15, wherein
the initial reset value of the corresponding cell of the second non-volatile memory is changed to a set value by a recall controller; and
one of the words of the identified corresponding cell is written to the register by a write controller.
20. The method of claim 19, wherein in response to the restoration in power, the write controller further comprises:
identifying whether the register has updated since the loss of power.

* * * * *